United States Patent [19]
Xu et al.

[11] Patent Number: 5,908,319
[45] Date of Patent: Jun. 1, 1999

[54] CLEANING AND STRIPPING OF PHOTORESIST FROM SURFACES OF SEMICONDUCTOR WAFERS

[75] Inventors: Han Xu, Lexington; Richard L. Bersin, Lawrence, both of Mass.

[73] Assignee: ULvac Technologies, Inc., Methuen, Mass.

[21] Appl. No.: 08/637,137

[22] Filed: Apr. 24, 1996

[51] Int. Cl.⁶ .................................................. H01L 21/302
[52] U.S. Cl. ........................... 438/725; 438/711; 438/727
[58] Field of Search .......................... 216/69; 156/643.1, 156/651.1, 653.1, 345 MW; 134/1.2, 1.3; 438/711, 725, 727

[56] References Cited

U.S. PATENT DOCUMENTS

| | | | |
|---|---|---|---|
| 4,493,855 | 1/1985 | Sachdev et al. | 427/41 |
| 4,559,243 | 12/1985 | Sachdev et al. | 427/38 |
| 4,562,240 | 12/1985 | Shibata et al. | 438/711 |
| 5,174,856 | 12/1992 | Hwang et al. | 156/643 |
| 5,198,634 | 3/1993 | Mattson et al. | 219/121.43 |
| 5,382,316 | 1/1995 | Hills et al. | 156/643 |
| 5,389,197 | 2/1995 | Ishimaru | 156/643 |
| 5,628,871 | 5/1997 | Shinagawa | 438/725 |
| 5,681,780 | 10/1997 | Mihara et al. | 438/725 |
| 5,785,877 | 7/1998 | Sato et al. | 216/67 |

FOREIGN PATENT DOCUMENTS

| | | |
|---|---|---|
| 0 304 068 | 2/1989 | European Pat. Off. . |
| 05275326 | 10/1993 | Japan . |

OTHER PUBLICATIONS

Journal of Applied Physics, vol. 72, No. 11, Dec. 1992, New York, pp. 5081–5088, XP000323870, Koretsky et al., "A Simple Model for the Etching of Photoresist with Plasma-Generated Reactants".

Journal of Vaccuum Science and Technology, Part B, vol. 9, No. 1, Feb. 1991, New York, pp. 8–25, XP000362449, Moisan et al., "Radio Frequency or Microwave Plasma Reactors π Factors Determining the Optimum Frequency of Operation".

*Primary Examiner*—Bruce Breneman
*Assistant Examiner*—Anita Alanko
*Attorney, Agent, or Firm*—Hale and Dorr LLP

[57] ABSTRACT

In a microwave downstream process, a microwave plasma is formed from a gas that has a small quantity of fluorine to enhance ashing without substantial oxide loss. This process can be performed before or after other microwave downstream processes or reactive ion etching processes.

30 Claims, 2 Drawing Sheets

CLEANING AND STRIPPING OF PHOTORESIST FROM SURFACES OF SEMICONDUCTOR WAFERS

FIELD OF THE INVENTION

This invention relates to the cleaning and stripping of photoresist from surfaces of semiconductor wafers during manufacturing.

BACKGROUND OF THE INVENTION

In the manufacture of a number of semiconductor devices on a wafer, photolithography steps and etching, thin film deposition, and/or ion implantation steps are alternately performed to build up the of the devices. The photolithography steps typically include steps of coating a wafer with a photoresist, typically an ultraviolet (UV) photosensitive organic material; exposing the photoresist through a mask; developing the resist; and etching the exposed resist to leave certain exposed areas on the wafer surface. Further processing steps, such as deposition, implantation, or etching can then be employed on the exposed areas.

Etching is typically performed with either a wet etching process in which the wafers are immersed in a chemical etchant; or a dry etching process, such as downstream microwave plasma etching or reactive ion etching (RIE). After photoresist is patterned on a surface and after further processing steps are performed in exposed areas, the photoresist is stripped.

Microwave downstream processing can be performed with atomic oxygen to strip resist when wafers cannot tolerate electrical damage. Because atomic oxygen is very chemically reactive, however, it can recombine very rapidly on the surface of a metal, such as aluminum that may be used in chambers for cleaning and stripping. The nature of these reactions, and the factors that influence the effects, are not well understood, so manufacturers have been discouraged from using aluminum chambers for microwave downstream ashing with atomic oxygen.

SUMMARY OF THE INVENTION

It has been found that if a process employing primarily oxygen and forming gas also adds a trace amount of a fluorine-containing gas, ashing rates are enhanced, the variability of the process to a metal surface is eliminated, and oxide loss is kept to a minimum. As defined here, a trace amount means less than about 0.5%, and preferably about 0.1% to 0.2%. This process can be combined with additional microwave downstream processes or RIE processes.

This process can be used to achieve high ashing rates in an aluminum chamber with reliable performance, independent of variations in the aluminum surface. The use of aluminum instead of quartz, which has been used by others, assures complete removal of charged ions from the gas stream before reaching the wafer, thus assuring that no electrical charging and no electrical damage is done to the devices on the wafers. Other features and advantages will become apparent from the following detailed description, drawing, and claims.

DETAILED DESCRIPTION

Figure 1:
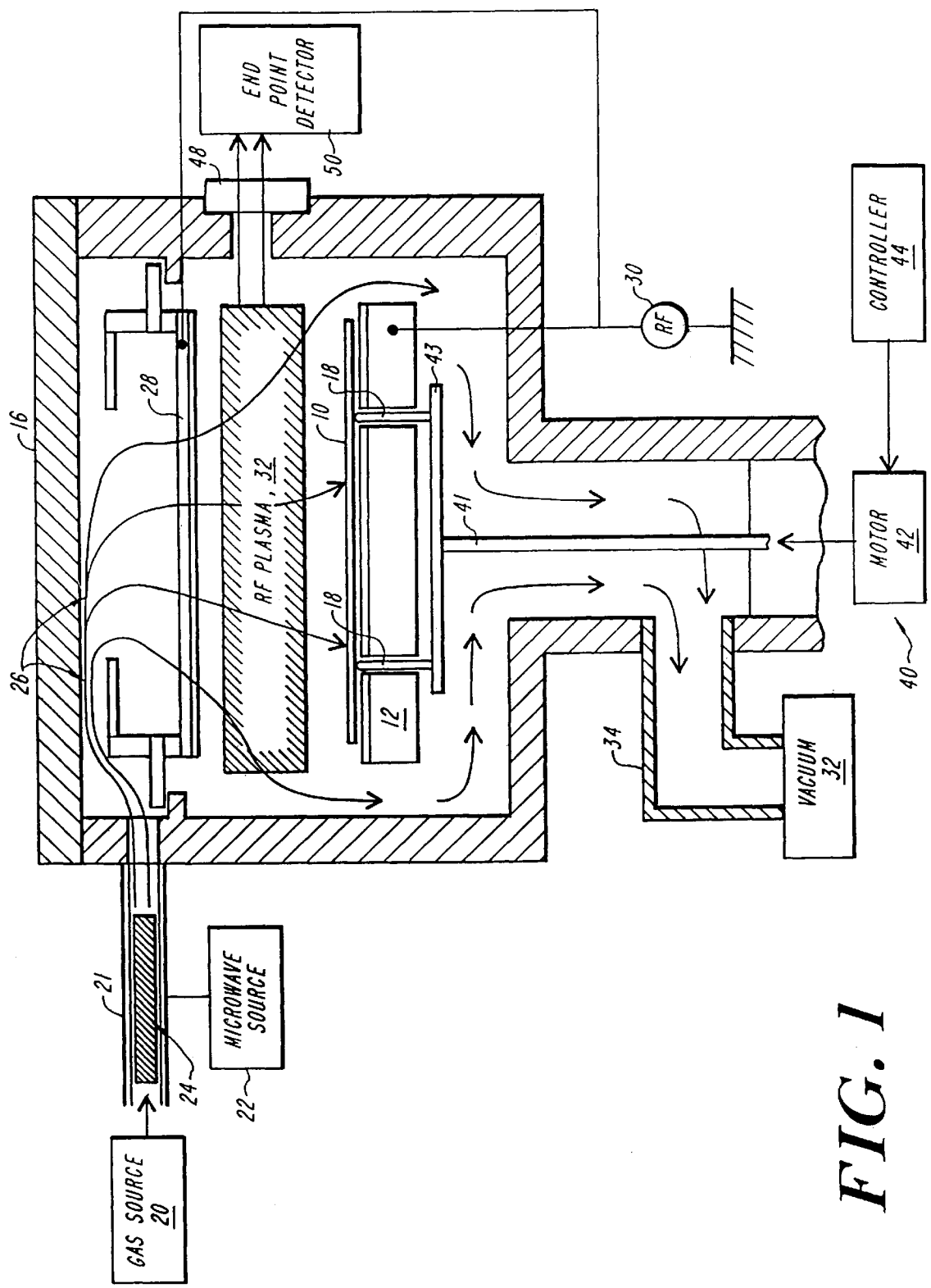
FIG. 1 is a partial pictorial, partial block diagram of an apparatus for etching and stripping.

Referring to FIG. 1, a semiconductor wafer 10 to be processed is positioned over a horizontally disposed hotplate 12 in an enclosed treatment chamber 16 for etching and/or cleaning. Wafer 10, which is typically flat and circular with a diameter of four to eight inches, rests horizontally on support pins 18 that extend through openings in hotplate 12 along its thickness direction. Wafer 10 and hotplate 12 thus lie in parallel horizontal planes.

A process gas is introduced into chamber 16 from a gas source 20 through an inlet pipe 21. A microwave source 22 at inlet pipe 21 causes a microwave plasma 24 to be formed at the inlet pipe, thus discharging a reactive gas 26 with a high concentration of active free radicals. Gas 26 passes through openings (not shown) in a top electrode 28 that is mounted above the wafer and is configured as in the incorporated patent. Under appropriate conditions, these active free radicals can thus decompose and evaporate a resist film on wafer 10 by converting the resist to gases. A vacuum 32 draws away these gases through an exhaust tube 34, and also maintains pressure on the order of 50–2000 mTorr in the chamber.

An RF source 30 is electrically coupled to top electrode 28 and to hotplate 12, which serves as a bottom electrode. Electrodes 28 and 12 thus form a double cathode. Source 30 provides an RF voltage that causes an RF plasma 32 to form over wafer 10. RF plasma 32 creates reactive ions that ash the resist from wafer 10.

A transparent cover 48 and an end point detector 50 are used to detect when ashing caused by the RF plasma begins and ends. End point detector 50 has a filter and an optical detector for detecting photons that are released in the RF plasma when OH radicals are formed during ashing.

A gas can be introduced from gas source 20 while microwave source 22 is activated to produce reactive gas 26 having a high concentration of free radicals discharged from the microwave plasma. An RF plasma can then be generated in the microwave-generated reactive gas 26 to ionize its free radicals. If, for example, a process gas from gas source 20 includes $CF_4$ and oxygen, the discharged gas from the microwave plasma has a high concentration of fluorine and oxygen radicals, respectively, in the gas over the wafer. If an RF plasma is then initiated in this discharge gas, the resulting ions that are produced are different from those in either the microwave discharge gas itself or from an RF plasma of $CF_4$ and oxygen gas without the microwave discharge. This different plasma has been found to substantially increase ashing during either etching or stripping.

Chamber 16 thus can be used to perform dry ashing with a downstream microwave process, an RIE process, both of these processes simultaneously, or both of these processes sequentially and/or alternatively. Two processes, called Hal and NoHal, developed by the assignee of the present invention, have been used previously for microwave downstream plasma etching.

One embodiment of the Hal process has the following process variables:

(1) 1000 sccm $O_2$;
(2) 30–150 sccm $N_2H_2$;
(3) 10–140 sccm $CF_{40}$ or $NF_3$;
(4) pressure of 0.45 Torr; and
(5) microwave power of 1500 W.

This process can be performed "cold," meaning at about 100° C. or less; or "hot", meaning at least at about 150° C. The fluorine, about 1%–10%, reacts with hydrogen in the resist to form HF that can be exhausted from the chamber; however, the reaction of fluorine and hydrogen also creates reactive sites on the resist surface where atomic oxygen can then react and ash at low temperature.

An embodiment of the NoHal process has the following process variables:

(1) 9000 sccm $O_2$;
(2) 540 sccm $N_2H_2$;
(3) pressure of 2 Torr;
(4) microwave power of 2000 W; and
(5) elevated temperature, e.g., 200° C.–280° C.

This process is performed hot and ashes without any loss of other silicon compounds. It is believed, however, that some oxygen is lost due to reactions in the chamber when chamber parts are made of aluminum.

The process according to the present invention is termed LoHal, a process that has process variables similar to NoHal, except that LoHal uses a small amount of a fluorine containing gas, such as $CF_4$, $NF_3$, or $SF_6$, preferably less than about 0.5%, and more preferably about 0.1% to 0.2%.

Preferred process conditions are as follows:

(1) gas mixture of oxygen 9000 sccm;
(2) $N_2H_2$ 540 sccm;
(3) $CF_4$ 5–20 sccm;
(4) microwave power of about 2,000 watts; and
(5) pressure of about 2.0 torr.

Figure 2:
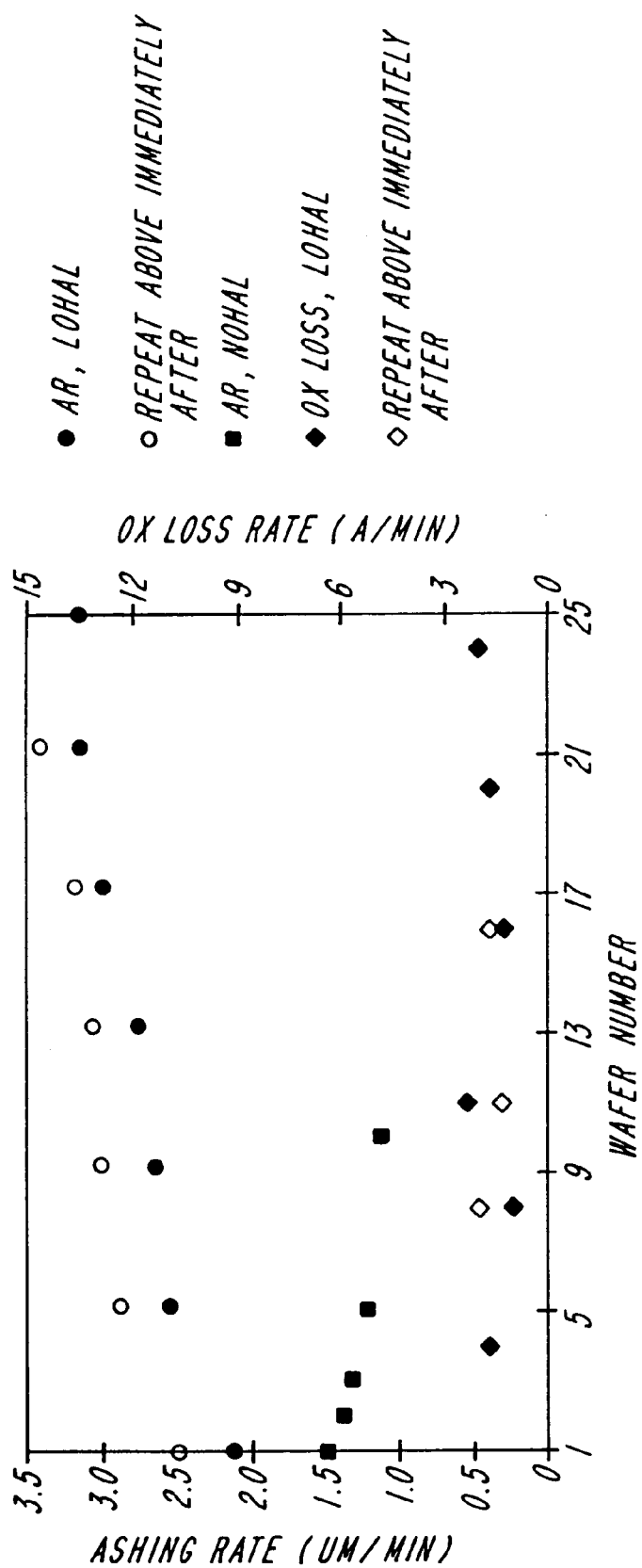
FIG. 2 is a graph comparing ashing rates and oxide loss for different processes.

Referring to FIG. 2, in samples processed at about 260° C., it has been found that LoHal has an ashing rate of about 2.5 to about 3 microns per minute, and up to almost 3.5 microns per minute when redone. This rate is about 2–3 times higher than the rate under a similar NoHal process. Because the quantity of fluorine is so small, no substantial etching of sensitive films, such as $SiO_2$ and $Si_3N_4$, has been observed. In these tests, the oxide loss was less than 3 angstroms per minute, even after a repeat test.

By monitoring optical emissions to measure oxygen radicals, the amount of oxygen radicals increased with a small amount of fluorine, suggesting that the fluorine prevents oxygen from attaching to the surface of the chamber and other components in the chamber. Thus it is believed that the fluorine passivates the surfaces in the chamber.

The LoHal process can be combined with other dry processes before or after the LoHal process. For example, a LoHal process can be followed by a Hal process, a reactive ion etching (RIE) process, or by a Hal process followed thereafter by an RIE process.

One example of such a process is one in which LoHal is combined with an RIE process including one of $CF_4$ and $NF_3$ for etching following a damascene process. In a damascene process, channels are etched in a silicon oxide prior to the deposition of metal to achieve fine-line metal definition and to eliminate the subtractive process of conventional etching of aluminum metal. It has been found, however, that etching in the oxide channel results in contamination of a resist mask with the formation of polymers that are difficult to remove, even with the aid of solvents. According to a process for removing such resist, and RIE plasma with oxygen is first utilized in order to break up and ash away a highly fluorinated skin that can form on the resist surface during the etching process. When this skin has been removed, a LoHal process is employed to ash away remaining organic materials. The remaining residues can then be rinsed away with deionized (DI) water to leave a clean surface.

Having described embodiments of the present invention, it should be apparent that modifications can be made without departing from the scope of the appended claims. While certain gases are recited, other gases can be used for removing resist.

What is claimed is:

1. A method for ashing a device with a resist layer including steps of:

(a) introducing a first gas including oxygen and an amount of a fluorine containing gas that is greater than 0% and less than about 0.2% of the first gas so that the fluorine enhances the rate of ashing the resist layer relative to ashing without fluorine while minimally ashing any oxide layers; and (b) forming a first microwave plasma from the introduced first gas and directing the first microwave plasma to the device with a resist layer to ash the device.

2. The method of claim 1, wherein the amount of fluorine containing gas is greater than 0.1% and less than about 0.2%.

3. The method of claim 1, wherein the fluorine containing gas is selected from a group consisting of $CF_4$, $NF_3$, and $SF_6$.

4. The method of claim 1, further comprising, after step (b) is completed, continuing to ash any remaining resist by:

(c) introducing a second gas including oxygen, the second gas being different from the first gas; and (d) forming a second microwave plasma from the introduced second gas and directing the second microwave plasma to the device.

5. A method for ashing a device with a resist layer including:

introducing a first gas including oxygen and an amount of a fluorine containing gas that is greater than 0% and less than about 0.5% of the first gas; and forming a first microwave plasma from the introduced first gas and directing the first microwave plasma to the device with a resist layer to ash the device;

introducing a second gas including oxygen, the second gas being different from the first gas; and forming a second microwave plasma from the introduced second gas and directing the second microwave plasma to the device, wherein the second gas includes 1%–10% of a fluorine containing gas.

6. The method of claim 5, wherein the fluorine containing gas is selected from a group consisting of $CF_4$, $NF_3$, and $SF_6$.

7. A method for ashing a device with a resist layer including:

introducing a first gas including oxygen and an amount of a fluorine containing gas that is greater than 0% and less than about 0.5% of the first gas; and forming a first microwave plasma from the introduced first gas and directing the first microwave plasma to the device with a resist layer to ash the device introducing a second gas including oxygen, the second gas being different from the first gas; and forming a second microwave plasma from the introduced second gas and directing the second microwave plasma to the device, and, after forming a second microwave plasma is completed, ashing any remaining resist by:

introducing a third gas; and forming an RF plasma from the third gas over the device to perform a reactive ion etching process.

8. A method for ashing a device with a resist layer including:

introducing a first gas including oxygen and an amount of a fluorine containing gas that is greater than 0% and less than about 0.5% of the first gas; and forming a first microwave plasma from the introduced first gas and directing the first microwave plasma to the device with a resist layer to ash the device, and, after forming a first microwave plasma is completed, ashing any remaining resist by:
introducing a second gas; and
forming an RF plasma from the second gas over the device to perform a reactive ion etching process.

9. A method comprising:
ashing a semiconductor device with a resist layer with an RF plasma to ash part of the resist layer;
introducing a gas including oxygen and an amount of fluorine-containing gas that is greater than 0% and less than 0.2% of the gas so that the fluorine enhances the rate of ashing the resist layer relative to ashing without fluorine while minimally ashing any oxide layers; and
forming a microwave plasma from the introduced gas to ash away at least part of the remainder of the resist layer.

10. The method of claim 9, further comprising, after step (b), a step of rinsing the device in DI water to remove any remaining residues.

11. A method for ashing a device with a resist layer including:
introducing a first gas including oxygen and an amount of a fluorine containing gas that is greater than 0% and less than about 0.5% of the first gas; and
ashing with a microwave downstream process using a gas primarily of oxygen, with about 1% to 10% of a fluorine containing gas;
forming a first microwave plasma from the introduced first gas and directing the first microwave plasma to the device with a resist layer to ash the device.

12. The method of claim 9, wherein the ashing is performed on the device after etching channels in a dielectric layer.

13. The method of claim 12, further comprising, after the forming step, depositing metal in the channel.

14. The method of claim 12, wherein the dielectric layer is silicon dioxide.

15. The method of claim 14, further comprising, after the forming step, depositing metal in the channel.

16. The method of claim 1, wherein the first gas consists of oxygen, forming gas, and the fluorine-containing gas.

17. The method of claim 5, wherein introducing a first gas includes introducing a gas with less than about 0.2% fluorine of the first gas.

18. The method of claim 7, wherein introducing a first gas includes introducing a gas with less than about 0.2% fluorine of the first gas.

19. The method of claim 8, wherein introducing a first gas includes introducing a gas with less than about 0.2% fluorine of the first gas.

20. The method of claim 11, wherein introducing a first gas includes introducing a gas with less than about 0.2% fluorine of the first gas.

21. The method of claim 1, further comprising, after the forming, rinsing the device in DI water to remove any remaining residues.

22. The method of claim 5, further comprising, after the forming, rinsing the device in DI water to remove any remaining residues.

23. The method of claim 7, further comprising, after the forming, rinsing the device in DI water to remove any remaining residues.

24. The method of claim 8, further comprising, after the forming, rinsing the device in DI water to remove any remaining residues.

25. The method of claim 11, further comprising, after the forming, rinsing the device in DI water to remove any remaining residues.

26. The method of claim 1, further comprising, after the forming, rinsing the device in DI water to remove any remaining residues.

27. The method of claim 5, further comprising, after the forming, rinsing the device in DI water to remove any remaining residues.

28. The method of claim 7, further comprising, after the forming, rinsing the device in DI water to remove any remaining residues.

29. The method of claim 8, further comprising, after the forming, rinsing the device in DI water to remove any remaining residues.

30. The method of claim 11, further comprising, after the forming, rinsing the device in DI water to remove any remaining residues.

* * * * *